United States Patent [19]

McElroy

[11] 4,139,785

[45] Feb. 13, 1979

[54] STATIC MEMORY CELL WITH INVERTED FIELD EFFECT TRANSISTOR

[75] Inventor: David J. McElroy, Houston, Tex.

[73] Assignee: Texas Instruments Incorporated, Dallas, Tex.

[21] Appl. No.: 801,695

[22] Filed: May 31, 1977

[51] Int. Cl.² .................. G11C 11/40; H03K 3/353
[52] U.S. Cl. .................................. 307/238; 307/304; 357/42; 357/59; 365/178; 365/181; 365/182; 365/188
[58] Field of Search .................. 307/238, 304; 357/23, 357/41, 42, 59; 365/178, 181, 182, 187, 188, 222

[56] References Cited
U.S. PATENT DOCUMENTS

| | | | |
|---|---|---|---|
| 3,593,037 | 7/1971 | Hoff, Jr. ............................ | 365/182 X |
| 3,618,053 | 11/1971 | Hudson et al. ................... | 365/222 X |
| 3,699,544 | 10/1972 | Joynson et al. .................. | 365/182 X |
| 3,744,037 | 7/1973 | Spence ............................ | 365/182 X |
| 3,997,881 | 12/1976 | Hoffmann ........................ | 307/238 X |
| 4,000,427 | 12/1976 | Hoffmann ........................ | 307/238 |
| 4,044,342 | 8/1977 | Suzuki et al. .................... | 307/238 X |
| 4,055,444 | 10/1977 | Rao ................................. | 357/23 |
| 4,060,796 | 11/1977 | Togei et al. ..................... | 307/238 X |
| 4,070,653 | 1/1978 | Rao et al. ........................ | 365/178 X |

*Primary Examiner*—Larry N. Anagnos
*Attorney, Agent, or Firm*—John G. Graham

[57] ABSTRACT

An integrated semiconductor memory device of the static type uses a memory cell circuit having an MOS transistor of the conventional type as the access transistor, along with a resistance element buried under field oxide and an inverted field-effect transistor formed by a polycrystalline layer over a gate region. The MOS transistor connects a storage node to the access line, and the inverted field-effect transistor connects the storage node to reference potential. The storage node is connected to a second node through the resistance element, and a resistor connects the second node to a voltage supply; the magnitude of the resistance element varies according to the voltage on the storage node. The impedance of the inverted field-effect is determined by the voltage on the second node which is a moat region forming the gate.

12 Claims, 10 Drawing Figures

STATIC MEMORY CELL WITH INVERTED FIELD EFFECT TRANSISTOR

BACKGROUND OF THE INVENTION

This invention relates to semiconductor devices and more particularly to a static memory cell made of MOS transistors and an inverted field-effect transistor.

Static memory cells have the advantage of requiring not refresh overhead as needed in dynamic memories. Various static cell designs have been proposed such as that set forth in copending application Ser. No. 691,252, filed May 28, 1976, by G. R. Mohan Rao, assigned to Texas Instruments, which avoids refresh, but at the expense of larger cell size and increased power dissipation. Various "self-refreshing" cells have been used such as shown in U.S. Pat. No. 3,955,181, issued May 4, 1976 to Joseph H. Raymond, Jr., for Self-Refreshing Random Access Memory Cell, assigned to Texas Instruments. RAM cells of very simple construction are shown in pending U.S. patent applications Ser. No. 700,989, filed June 29, 1976, now U.S. Pat. No. 4,070,653, by G. R. Mohan Roa, David J. McElroy and Gerald D. Rogers; Ser. No. 754,208, filed Dec. 27, 1976 by David J. McElroy, and Ser. No. 762,916, filed Jan. 27, 1977 by David J. McElroy, all assigned to Texas Instruments. These prior cells provide either static operation, or apparently static operation in that refresh is accomplished without addressing the cells, and are of successively smaller cell size and had operating or process advantages. However, continuing improvement in cell size or power dissipation, as well as process compatibility, became necessary with higher density memories of the 16K and 64K variety.

It is a principal object of this invention to provide improved memory cells in semiconductor integrated circuits. Another object is to provide an improved static cell for MOS memory devices, particularly a static cell of small size and low power dissipation. An additional object is to provide small area memory elements in semiconductor integrated circuits, particularly made by processes compatible with MOS/LSI standard products.

SUMMARY OF THE INVENTION

An integrated semiconductor memory device of the static type uses a memory cell circuit having an MOS transistor of the conventional type as the access transistor, along with a resistance element buried under field oxide and an inverted field-effect transistor formed by a polycrystalline layer over a gate region. The MOS transistor connects a storage node to the access line, and the inverted field-effect transistor connects the storage node to reference potential. The storage node is connected to a second node throught the resistance element, and a resistor connects the second node to a voltage supply; the magnitude of the resistance element varies according to the voltage on the storage node. The impedance of the inverted field-effect is determined by the voltage on the second node which is a moat region forming the gate.

BRIEF DESCRIPTION OF THE DRAWINGS

The novel features believed characteristic of the invention are set forth in the appended claims. The invention itself, however, as well as other features and advantages thereof, will best be understood by reference to the following detailed description of illustrative embodiments, read in conjunction with the accompanying drawings, wherein:

FIGS. 3a-3d are elevation views in section of the semiconductor device of FIG. 1, taken along the lines a—a, b—b, c—c, and d—d respectively;

DETAILED DESCRIPTION OF SPECIFIC EMBODIMENT

Figure 1:
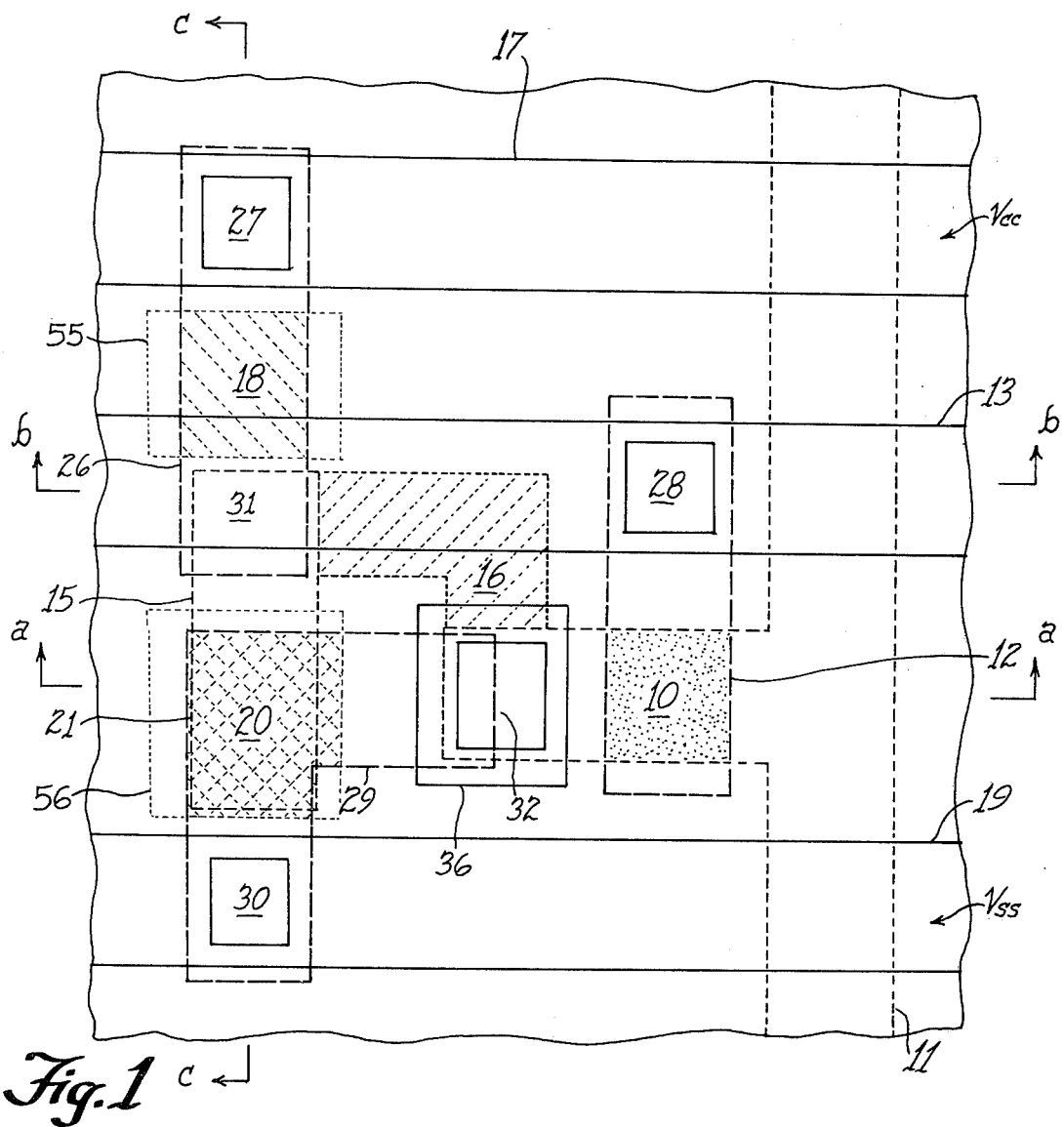
FIG. 1 is a greatly enlarged plan view of a small portion of a semiconductor chip showing the physical layout of a memory cell according to the invention.
Figure 2:
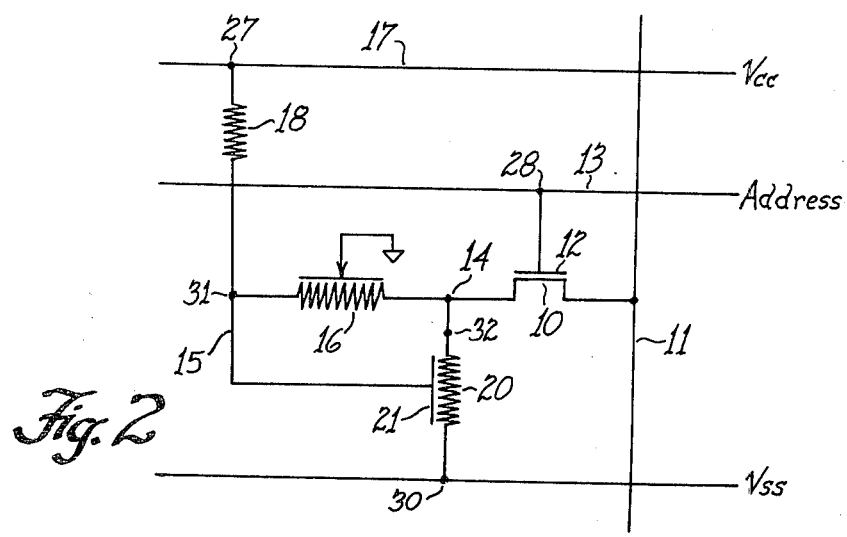
FIG. 2 is an electrical schematic diagram of the static memory cell of FIG. 1.

A memory cell according to the invention is illustrated in physical layout in FIG. 1 and in electrical schematic diagram in FIG. 2. The cell includes an N-channel MOS access transistor 10 which is connected to a Y-select line or bit line 11 which is an elongated N+ moat region. The gate 12 of the MOS transistor 10 is connected to an X-select or word line 13 which in this embodiment is a metal strip. In a 16K array of these memory cells, there would be 128 Y lines and 128 X lines; only one cell is shown. The source-to-drain path of the transistor 10 is connected to a storage node 14, also an N+ diffused region. The node 14 is connected to another storage node 15 by a resistor 16 which is an implanted resistor buried under field oxide as disclosed in pending applications Ser. No. 691,252, filed May 28, 1976 by G. R. Mohan Rao, or Ser. No. 700,989, filed Jan. 29, 1976 by Rao, McElroy and Rogers, both assigned to Texas Instruments. This resistor 16 will exhibit a magnitude of resistance related to the voltage on the nodes 14 and 15. The node 15 is connected to a Vdd or Vcc supply line 17 by a resistor 18 which may be lightly implanted area in a polycrystalline silicon strip as set forth in pending application Ser. No. 727,116, filed Sept. 27, 1976 by Rao, Stanczak, Lien and Bhatia, assigned to Texas Instruments. The voltage supply line 17 is in this case a metal strip. The node 14 is connected to a Vss or ground line 19, also a metal strip, by a resistor 20 which is an implanted polycrystalline silicon resistor similar to the resistor 18, but "P-channel" rather than "N-channel."

An important feature of the invention is the use of a "gate" region 21 for the resistor 20 to modulate the resistance magnitude exhibited between the node 14 and Vss line 19. This gate region is connected to the node 15 and indeed is part of the same moat region which forms the node 15. The impedance of the resistor 16 is high when the voltage on the node 15 is highly positive, or low when the node 15 is near ground.

In operation, a logic "1" is written into the node 14 if the transistor 10 is turned on by a "1" on the address line 13 and a "1" on the bit line 11. Usually "1" is about Vcc which can be +12 v dc or +5 v dc, and logic "0" is Vss. When the node 14 is high, the node 15 will tend to be high, holding the impedance of the resistor 20 very high by the large positive voltage on the gate 21 which depletes the polycrystalline silicon layer of the resistor 20 of holes or positive carriers. The impedance of the buried implanted resistor 16 is also high when a "1" is stored because the reverse bias on the pn junction between the implanted N-region of the resistor and the P-substrate is high, depleting the resistor of carriers. Under these conditions, after the address on the line 13 goes to Vss and the transistor cuts off, current flow through the series path of the resistors 18, 16 and 20 will be very low and the node 15 will be held at near the Vcc supply voltage on the line 17, reinforcing the high voltage on the gate 21 and holding the impedance of the resistor 20 high. If a "0" is written into the cell, the node 14 discharges into the line 11 which is at Vss. The impedance of the resistor 16 goes to a low value because the reverse bias of the pn junction between the resistor region and the substrate is reduced. The voltage on the node 15 and thus the gate 21 goes to near Vss, and the result is that the resistor 20 assumes a low resistance state. Current flow through the resistor 18 is higher and the voltage drop across it is higher; almost all of the drop between Vcc of line 17 and Vss of line 19 is across the resistor 18 rather than the resistors 16 and 20. Thus, after the transistor 10 is cut off, a stored "0" will be sustained on the storage node 14.

Figure 3A:
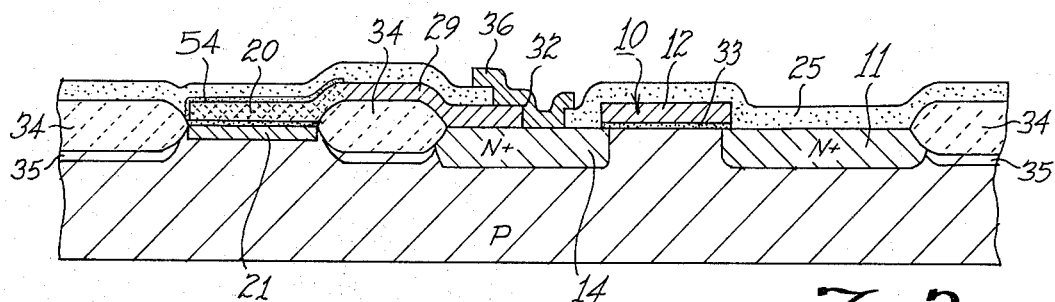
Figure 3B:
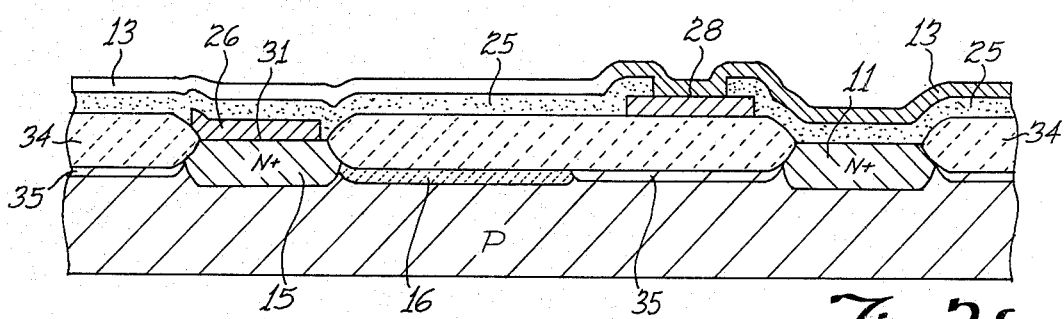
Figure 3C:
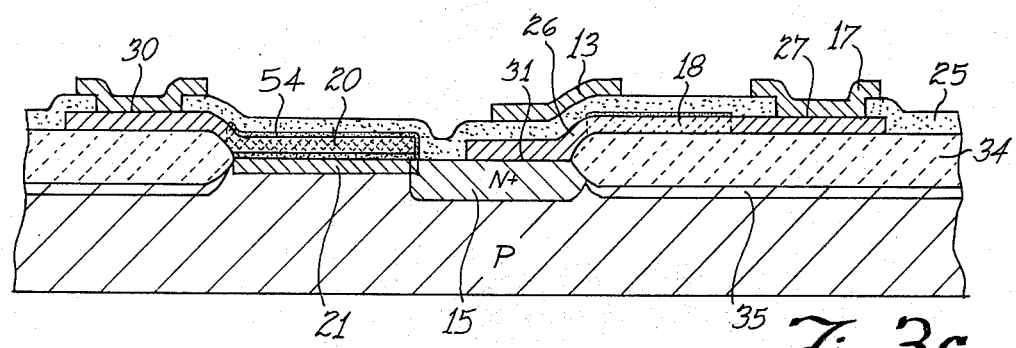

In FIGS. 3a, 3b and 3c sectional views of the cell of FIG. 1 show details of construction. A very small part of a semiconductor substrate is seen, perhaps one or two mils in width, it being understood that a memory device would contain perhaps 16384 cells in a silicon chip of less than one-twentieth square inch. The Vcc, Vss and X address lines 17, 19 and 13 are metal strips, perhaps 0.2 mil wide and 1 micron thick, overlying a thick low-temperature oxide layer 25. The metal lines contact the underlying polycrystalline layer through holes in the oxide layer 25 at three points: the Vcc line 17 contacts the end of a polycrystalline silicon strip 26 at a contact area 27; the address line 13 contacts the polysilicon strip of the gate 12 at a contact area 28; the Vss line contacts a polysilicon strip 29 at a contact area 20. The polysilicon strip 26 has the resistor 18 formed therein by a lightly implanted phosphorus doped region in the central part of the strip, while the ends of the strip are heavily doped with phosphorus to be highly conductive, "N+ type". A contact area 31 between the poly strip 26 and the N+ moat region of the node 15 makes the connection between the resistor and the node. A contact area 32 between the N+ moat of the node 14 and the poly strip 29 makes the connection at this point. A thin oxide coating 33 forms the gate insulator of the transistor 10 and the insulation between the underlying gate 21 and "P-channel" resistor 20. A thick field oxide coating 34 surrounds all of the moat area, and P+ type channel stop regions 35 underly all of the field oxide areas except where the implanted resistor 16 is formed.

The polysilicon resistor 20 functions as a P-channel transistor with its gate formed by the moat beneath it, so it is inverted compared to the usual MOS transistors where the channel is in the moat and the gate in the polysilicon. The resistor 20 is lightly P-type or boron-doped, opposite from the phosphorus-doped poly resistor 18, and the ends of the poly strip 29 containing the resistor 20 must be P+ to make ohmic connection to the resistor, so these ends are heavily boron implanted. The aluminum strip 19 makes adequate ohmic contact to the poly strip 29 when it is heavily doped by boron implant, but the connection between the other end of the poly strip 29 and the N+ moat 14 at the contact area 32 would be a pn junction if only poly-to-moat contact were made. Thus, a discrete metallization area 36 provides an ohmic connection by contacting both moat and poly. The metal-to-moat contact is ohmic and the metal-to-poly is ohmic, even though poly-to-moat is not.

Referring now to FIGS. 4a–4f and 5a–5f, a process for making the MOS integrated circuit device of FIGS. 1 and 3a–3c will be described. FIGS. 4a–4f and 5a–5f represent sectional views along the lines a—a and 5—5 of FIG. 1, chosen to illustrate formation of the transistor 10, the field-implanted resistor 16, and the P-channel and N-channel implanted poly resistors 18 and 20. The starting material is a slice of P-type monocrystalline silicon, perhaps 3 inches in diameter and 20 to 40 mils thick, cut on the <100> plane, of a resistivity of about 6 to 8 ohm-cm. In the FIGURES, the part shown of a chip or bar 40 represents only a very small part of the slice, perhaps one or two mils wide or one ten-millionth of the slice. After appropriate cleaning, the slice is oxidized by exposing to oxygen in a furnace at an elevated temperature of perhaps 1000° C. to produce an oxide layer 41 of a thickness of about 1000Å. Next, a layer 42 of silicon nitride of about 1000Å thickness is formed by exposing to an atmosphere of silane and ammonia in an rf plasma reactor. A coating 43 of photoresist is applied to the entire top surface of the slice, then exposed to ultraviolet light through a mask which defines the desired pattern, and developed. In place of uV light and glass masks as used at present, resist may be exposed by an electron beam to produce smaller geometries, as set forth at Bell Laboratories Record, March 1976, p. 69–73 or Electronic Products, February 1977, p. 17. The photoresist operation leaves an area 44 where nitride is to be etched away by an etchant which removes the exposed part of the nitride layer 42 but does not remove the oxide layer 41 and does not react with the photoresist 43. In this area 44 the resistor 16 is to be formed.

The slice is now subjected to an ion implant step, whereby phosphorus atoms are implanted in an area 45 of silicon not covered by photoresist 43 and nitrite 42 to create the resistor. The photoresist is preferably left in place to mask the implant. The oxide layer 41 during the implant prevents implanted phosphorus from out-diffusing and minimizes surface damage. This implant is at a dosage of about $5 \times 10^{10}/cm^2$ at 70 to 150 KeV. The selection of energy level used will provide a control over the cut-off voltage, with higher energy level providing a higher cut-off. As will be seen, the region 45 does not exist in the same form in the finished device, because some of this part of the slice will have been consumed in the field oxidation procedure.

Next, the photoresist coating 43 is removed and another photoresist coating 46 is applied over the entire slice, then exposed to uV light through a mask which exposes everything except what is to become the moats, i.e., the gate 21, transistors and N+ diffused regions. Upon developing, unexposed photoresist is removed in areas 47 in FIGS. 4b and 5b. The region 45 where resistor 16 will be created is covered. The nitride layer 42 is etched away in the areas 47, the oxide 41 is left in place as before, and then the slice is subjected to a boron implant at 100 KeV at a dosage of about $4 \times 10^{12}/cm^2$. Heavily doped P+ regions 48 will be produced in the surface to ultimately provide the channel stop regions. The remaining photoresist 46 then would be removed.

As set forth in copending patent application Ser. No. 648,593, filed Jan. 12, 1975, now U.S. Pat. No.

4,055,444, by G. R. Mohan Rao, assigned to Texas Instruments, the next step in the process is to subject the slice to a heat treatment or annealling step, during which the slice is maintained at a temperature of about 1000° C. for perhaps approximately 2 hours in an inert atmosphere, preferably nitrogen. This step causes the implanted boron and phosphorus concentrations to exhibit a redistribution which has desirable effects, and also causes a reduction in bulk damage in the crystal structure. The pand N impurities will have penetrated deeper into the silicon surface after anneal.

Figure 4:
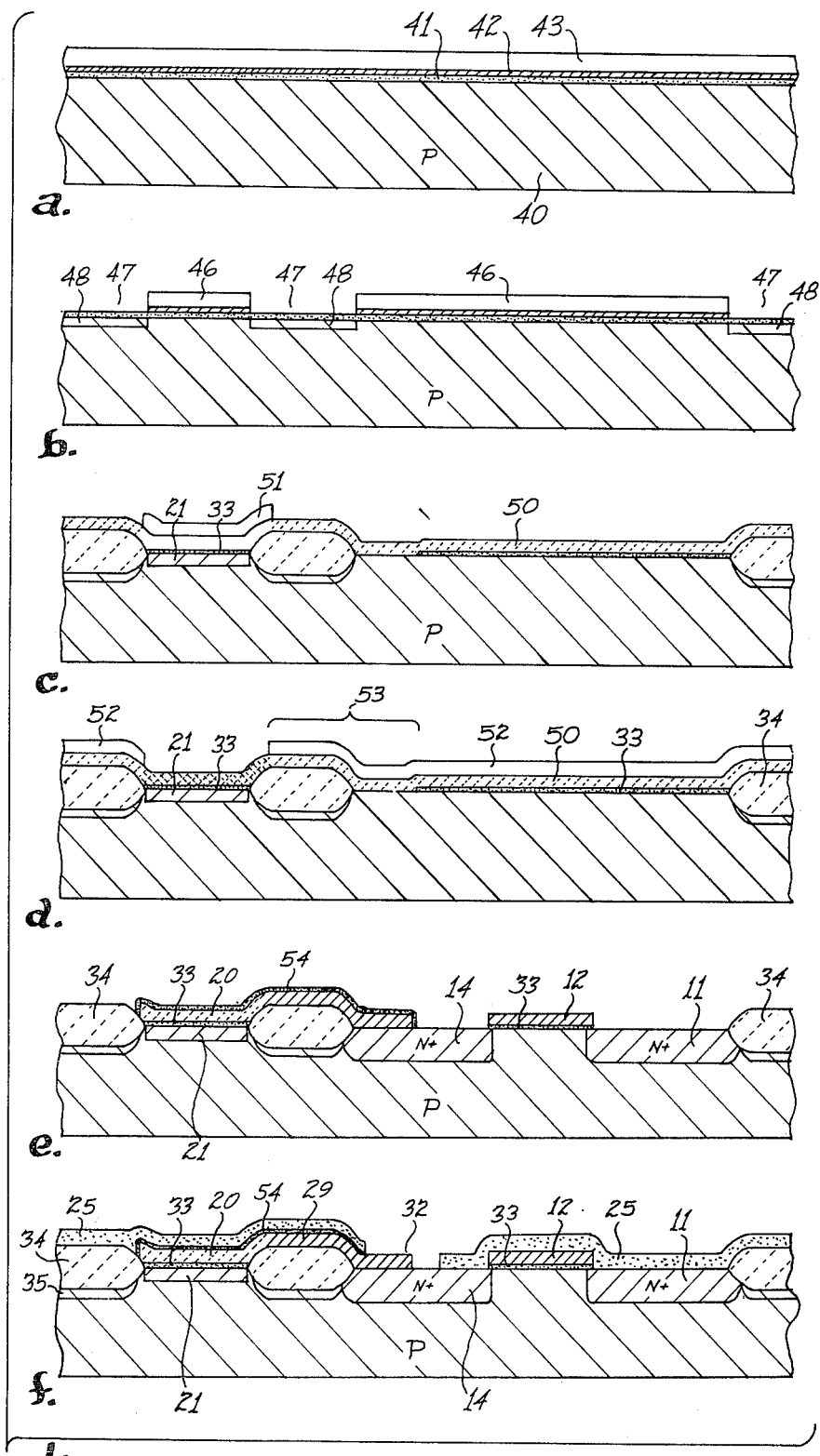
FIGS. 4a-4f and 5a-5f are elevation views in section of the semiconductor device of FIGS. 1 and 3a-3d, at successive states in the manufacturing process, taken along the line a—a or 5—5 in FIG. 1.
Figure 5:
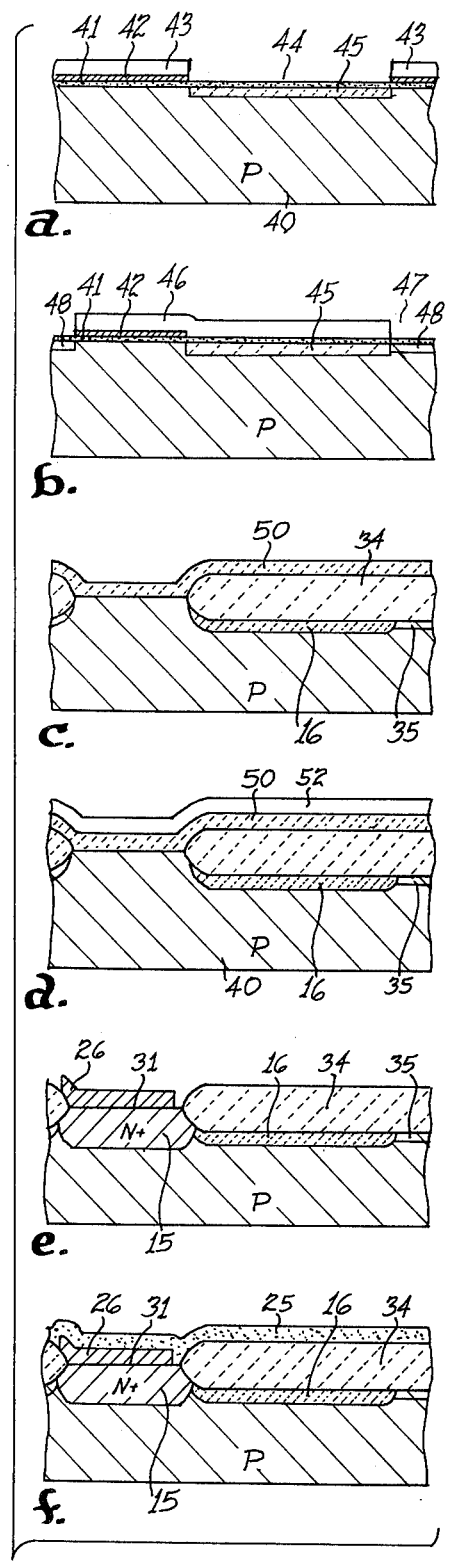

The following step in the process is formation of field oxide 34, which is done by subjecting the slices to steam or an oxidizing atmosphere at about 900° C. for perhaps 10 hours. The causes a thick field oxide region or layer 34 to be grown as seen in FIGS. 4c or 5c, and this region extends into the silicon surface because silicon is consumed as it oxidizes. The nitride layer 42 masks oxidation beneath it. The thickness of this layer 34 is about 8000 to 10,000Å, about half of which is above the original surface and half below. The boron doped P+ regions 48 and the phosphorus doped N region 45 formed by implant and modified by the anneal step will be partly consumed, but will also diffuse further into the silicon ahead of the oxidation front. Thus, P+ "channel-stop" regions 35 and the N resistor region 16 will result which will be of proper concentration near the surface and will not have the extent of crystalline structure damage characteristic of some implanted devices.

The nitride layer 42 and its underlying oxide layer 41 are removed by etching, as the next step, and another thin oxide layer 33 of about 8000Å is grown over the exposed areas of silicon. This layer 33 later becomes the gate insulators of the transistors as well as the dielectric between the gate 21 and the poly resistor 20. At this point, the gate region 21 is phosphorus implanted at a dosage of about $10^{16}$, using a photoresist mask. Next, windows for polycrystalline silicon-to-silicon or poly-to-moat contacts are patterned and etched in the oxide layer 33 using photoresist. A layer 50 of polycrystalline silicon is deposited over the entire slice in a reactor using standard techniques as by decomposition of silane in hydrogen at about 950° C. to a thickness of about 0.5 micron, producing polysilicon which will become the gate 12 of the transistor 10 and the strips 26 and 29. The polycrystalline silicon should be highly resistive or low concentration so that the resistors 18 and 20 can be formed with control over resistivity.

The entire polysilicon coating 50 except for a photoresist mask 51 over the area of the resistor 20 is now subjected to a phosphorus implant which creates the characteristics of the resistor 18. Areas of poly which are to be highly conductive N+ will be later subjected to a phosphorus diffusion which will leave them highly doped. To define the resistor 18, this phosphorus implant is at 100 to 150 KeV to a dosage of from $5 \times 10^{13}$ to $1 \times 10^{14}$ atoms per cm$^2$, depending upon the desired sheet resistivity. Then a photoresist mask 52 which exposes only the area of the resistor 20 is applied and this area is boron implanted at about the dosage of the preceding phosphorus implant. Instead of employing this boron implant, the virgin polysilicon layer 50 may provide the proper characteristics of the resistor 20 if it is of high resistivity or very low boron concentration, i.e., essentially $\pi$-type or intrinsic with a concentration below about $10^{12}$/cc. In any event, another boron implant is needed at this point to heavily dope the areas at both ends of the strip 29 for contact to the resistor 20 and to facilitate making ohmic connections at contact areas 30 and 32; this implant would be at a dosage exceeding $10^{16}$/cm$^2$ and would employ another photoresist operation which leaves implant mask areas 53 as seen in FIGS. 4d and 5d. Following these implants, the slice is annealled in N$_2$ for 30 minutes at 1000° C. to distribute the phosphorus or boron properly in the polysilicon.

The polysilicon layer 50 and underlying gate oxide or thin oxide layer 33 are next patterned by applying photoresist, exposing to ultraviolet light through a mask prepared for this purpose, developing, then etching with the remaining photoresist covering certain areas of the polysilicon. The resulting structure is seen in FIGS. 4e and 5e, where a part of the remaining polysilicon layer provides what will be the gate 12 of MOS transistor 10 and the strips 26 and 29, and thin oxide 33 underneath it is the gate oxide of the transistor. These same layers also provide gate and gate oxide for all the other transistors on the slice, as well as capacitors if any are needed in peripheral circuits. After patterning the poly, a protective cap of silicon dioxide is grown over the polysilicon, producing a coating 54 on all exposed surfaces of the poly, including tops and sides. The coating 54 is grown at about 900° C. in steam for perhaps two hours, producing approximately 2000 to 3000Å thickness and consuming part of the polysilicon. The cap is to prevent subsequent deposition of impurity on the resistors 18 and 20 or diffusion into these resistors.

A photoresist mask and etch operation is next used to remove the coating 54 on all areas of the polysilicon except the resistors 18 and 20. The mask used to protect the resistors leaves oxide over areas defined by dotted lines 55 and 56 in FIG. 1; these are much wider than the resistors, allowing a rather wide margin for error in mask alignment. The resulting structure is seen in FIGS. 4e and 5e.

Using the thin oxide 33, protective cap 54, and field oxide 34 as a diffusion mask, the slice is now subjected to an N+ diffusion, whereby phosphorus is diffused into the silicon slice 40 as seen in FIGS. 4e and 5e to produce regions 11, 14, and 15. Phosphorus diffuses into the exposed polysilicon, so it becomes heavily doped N+ and very conductive. The poly does not mask the diffusion, so N+ regions are created beneath the poly where there is no thin oxide 33. The depth of diffusion is about 8000 to 10,000Å. The N+ diffused regions function as conductors which connect the various regions together, and also function as the source or drain regions of all the MOS transistors and connection to the previously implanted gate 21.

As seen in FIGS. 4f or 5f, fabrication of the device is continued by depositing the layer 25 of phosphorus-doped oxide. Rather than by oxidizing, this is done by a low temperature reaction process using conventional chemical vapor deposition techniques. The layer 24 is about 6000 to 10,000Å, covering the entire slice. Subsequently, windows are opened in the oxide layer 25 in areas 27, 28, 30, and 32 where contact is to be made to regions of the silicon or to the polysilicon layer. Then, a layer of aluminum is deposited on the entire slice, and etched away using photoresist masking to provide the desired pattern of metal interconnections 13, 17 and 19, as well as the discrete metal area 36 for the contact 32.

Subsequently, the slice would be covered with protective oxide and this oxide would be patterned to expose bonding pads. Then the slice is scribed and broken into separate chips, each containing a 16K array of cells along with peripheral decoder and I/O circuitry, and the chips are mounted in sealed packages.

Figure 6:
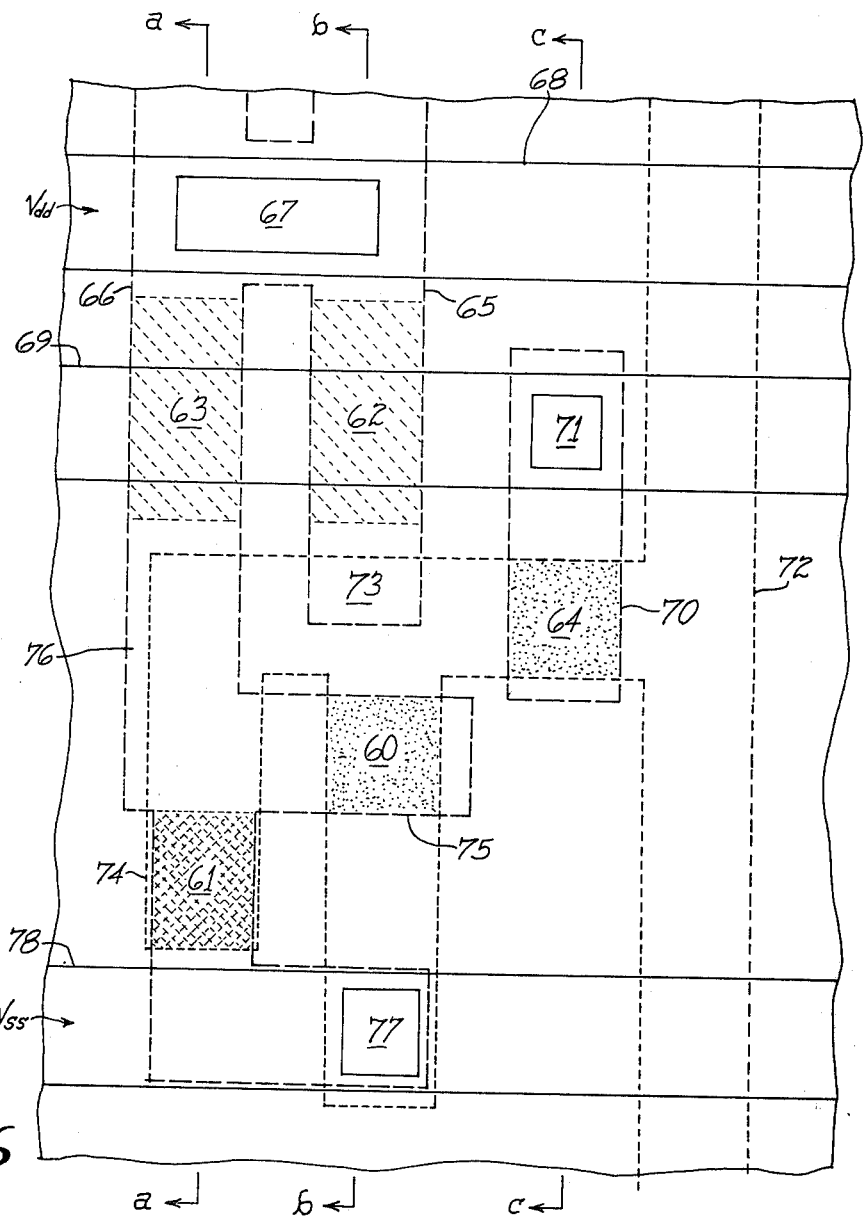
FIG. 6 is a greatly enlarged plan view of a layout of another embodiment of a static cell using the invention.
Figure 7:
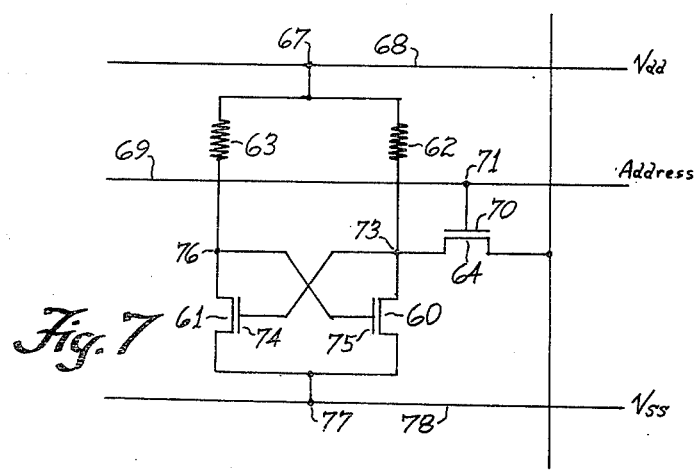
FIG. 7 is a schematic diagram of the cell of FIG. 6.
Figure 8:
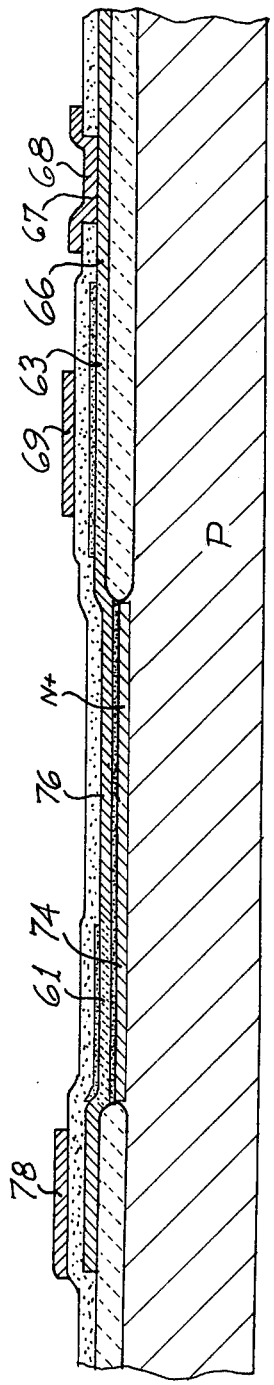
FIGS. 8a-8c are elevation views in setion of the semiconductor device of FIG. 6, taken along the lines a—a, b—b, and c—c in FIG. 6.
Figure 8:
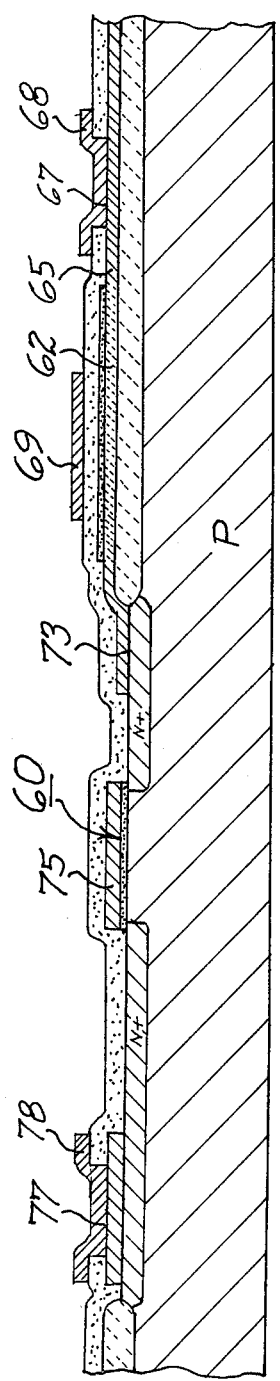
Figure 8:
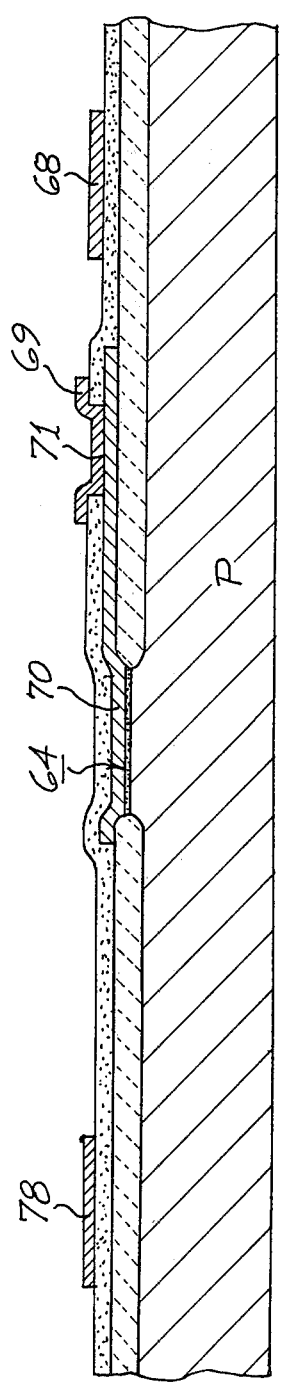

Referring to FIG. 6, a static RAM cell of the flip-flop type is shown in layout, with the electrical schematic seen in FIG. 7. This cell uses the classic pairs of cross-coupled driver transistors 60 and 61 and load resistors 62 and 63, along with an access transistor 64. The driver transistor 60 and the access transistor 64 are of conventional N-channel silicon-gate form, while the transistor 61 is an inverted transistor according to the invention. Use of the inverted transistor allows the cell to be smaller because fewer contacts and interconnections are needed, these being the common areas where space is not well utilized in flip-flop type cells.

In FIGS. 6 and 7 the resistors 62 and 63 are lightly phosphorus implanted in polycrystalline silicon strips 65 and 66 which are connected at a contact area 67 to a metal strip forming the Vcc line 68. The address line 69, also a metal strip, is connected to a polysilicon gate 70 of the transistor 64 by a metal-to-poly contact area 71. An elongated N+ diffused moat region forms the bit line 72 and the source-to-drain path of the access transistor 64 in part of this moat, as are similar transistors in all of the other cells in this column of the memory array (128 in a 16K RAM). A node 73, part of the same N+ moat, forms an output node for the cell and one end of the source-to-drain path of the driver transistor 60, as well as a "gate" region 74 for the transistor 61. The gate 75 for the driver transistor 60 is part of the polycrystalline silicon strip 66 in which the resistor 63 is formed and in which a node 76 represents the other node of the flip-flop; the inverted transistor 61 is formed in part of this same strip 66 extending from the node 76. A metal-to-poly-to-moat contact area 77 connects the sources of both of the transistors 60 and 61 to a Vss line 78. Where the poly strip 66 must cross the moat, and N+ area 79 is created by a phosphorus implant masked by a separate photoresist operation, otherwise the method of manufacture is the same as above. The polycrystalline silicon of the transistor 61, separated from the N+ moat of the gate 74 by thin gate oxide, is π-type or slightly P-type, and it will become more conductive as the voltage on gate 74 becomes more positive.

The cell of FIGS. 6 and 7 is duplicated in an array by rotating about an axis 80 so the Vdd line is shared with a mirror-image cell above that of FIG. 6, and rotating about an axis 81 so the Vss line is shared with a mirror-image cell below that of FIG. 6. In like manner, the cell of FIG. 1 is duplicated in an array by rotating about the Vcc line and the Vss line so that these lines as well as contacts 27 and 30 are shared with cells above and below.

In another embodiment of the cell of FIGS. 1 and 2, the contact 30 is connected to the X address line 13, instead of Vss, to produce a cell of similar operation but destructive read. That is, instead of having a Vss line 19, the line 19 becomes the address line 13 and the contacts 28 and 30 are merged as one, located just below the gate 12 in the view of FIG. 1. Otherwise, the cell is the same. In this embodiment, an MOS capacitor may be added between the Vcc line 17 and the node 14 by extending the end of the poly strip 26 adjacent the contact area 27 down over part of the N+ moat of the node 14 (this part of the moat would be enlarged and extended up toward the Vcc line 17); the poly and moat would be separated by gate oxide 33. This would facilitate reading and writing. Another alternative is the connect the contact 30 to the substrate by a P+ diffusion in this area and a poly-to-substrate contact; this would eliminate the need for the Vss line 19, reducing the size of a cell array.

While this invention has been described with reference to illustrative embodiments, this description is not intended to be construed in a limiting sense. Various modifications of the illustrative embodiments, as well as other embodiments of the invention, will be apparent to persons skilled in the art upon reference to this description. It is therefore, contemplated that the appended claims will cover any such modifications or embodiments as fall within the true scope of the invention.

What is claimed is:

1. A semiconductor integrated circuit comprising an MOS transistor having a source-drain path and a gate, the source-drain path being connected between a first node and a source of logic levels, the gate of the transistor being connected to a different source of logic levels, a second node, resistance means connecting the second node to a voltage supply, an impedance element connecting the first node to the second node, the impedance element exhibiting a low impedance state when the voltage on the first and second nodes is at a first level and exhibiting a high impedance state when the voltage on the first and second nodes is at a second level, the second level being a higher voltage than the first level, and voltage-responsive impedance means having a current path and a control electrode, the current path connecting the first node to reference potential, the control electrode of the impedance means being connected to the second node.

2. A circuit according to claim 1 wherein the impedance means functions as a field effect transistor.

3. A circuit according to claim 2 wherein the impedance means is a polycrystalline silicon layer having a resistivity defined by ion implant and having a low impurity concentration.

4. A circuit according to claim 3 wherein the layer which forms the impedance means overlies a thin thermal oxide layer on a face of a silicon body and said second node is an N+ region beneath the oxide layer.

5. A circuit according to claim 1 wherein the impedance means exhibits a low impedance when the voltage on the second node is low and a high impedance when the voltage on the second node is high.

6. A circuit according to claim 5 wherein the impedance means is a P-channel field-effect resistor.

7. A circuit according to claim 6 wherein the source of logic levels is a bit line in a memory array, the different source of logic levels is an address line in the memory array, and the first node is a storage node capable of sustaining a logic "1" or logic "0".

8. A semiconductor integrated circuit storage cell comprising an address line, a data line, a storage node, a first controlled switching device having a current path connecting the data line to the storage node and being controlled by the address line, a voltage supply and a reference potential, a second controlled switching device having a control element and having a current path connecting the storage node to the reference potential, voltage-controlled resistance means connecting the storage node to a second node, the second node underlying said current path and providing the control element of the second switching device, and impedance means connecting the voltage supply to the second node.

9. A storage cell according to claim 8 wherein the resistance means exhibits a large change in resistance when the voltage at its terminals changes from near reference potential to near the value of the voltage supply.

10. A storage cell according to claim 8 wherein the first controlled switching device is an MOS transistor, the resistance means is a field-implanted junction-type field effect transistor, and the second controlled switching device is a field-effect resistor formed by a layer of polycrystalline silicon overlying a moat region separated therefrom by thin oxide.

11. A storage cell according to claim 10 wherein the resistance means comprises an ion-implanted region beneath a thick, thermally-grown oxide layer.

12. A semiconductor integrated circuit storage cell comprising an address line, a data line, a storage node, an MOS transistor having a current path connecting the data line to the storage node and being controlled by the address line, a voltage supply and a reference potential, a field-effect resistor formed by a layer of polycrystalline silicon overlying a moat region separated therefrom by this oxide, the resistor connecting the storage node to the reference potential, a voltage-controlled field-implanted junction-type field effect, transistor connecting the storage node to a second node, the second node being connected to the moat region which defines a control element for the field effect resistor, and impedance means connecting the voltage supply to the second node.

* * * * *